(12) United States Patent
Zhou et al.

(10) Patent No.: US 11,380,978 B2
(45) Date of Patent: Jul. 5, 2022

(54) ELECTRONIC PACKAGE AND METHOD FOR FABRICATING THE SAME

(71) Applicant: Siliconware Precision Industries Co., Ltd., Taichung (TW)

(72) Inventors: Shi-Min Zhou, Taichung (TW); Han-Hung Chen, Taichung (TW); Rung-Jeng Lin, Taichung (TW); Kuo-Hua Yu, Taichung (TW); Chang-Fu Lin, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 415 days.

(21) Appl. No.: 15/961,103

(22) Filed: Apr. 24, 2018

(65) Prior Publication Data

US 2019/0123424 A1 Apr. 25, 2019

(30) Foreign Application Priority Data

Oct. 20, 2017 (TW) ................................. 10613612.7

(51) Int. Cl.
*H01L 23/28* (2006.01)
*H01Q 1/22* (2006.01)
(Continued)

(52) U.S. Cl.
CPC ........... *H01Q 1/2283* (2013.01); *H05K 1/144* (2013.01); *H05K 1/181* (2013.01); *H05K 3/28* (2013.01);
(Continued)

(58) Field of Classification Search
CPC ...... H01Q 1/2283; H05K 1/181; H05K 3/368; H05K 3/341; H05K 3/28; H05K 1/144; H05K 1/0243; H05K 2201/042; H05K 2201/049; H05K 2201/10734; H05K 2201/2036; H05K 2201/10545; H05K 2201/09063; H05K 2201/10674; H01L 24/16; H01L 2224/16227; H01L 23/49822; H01L 23/49833; H01L 23/49816; H01L 2224/48227; H01L 24/48; H01L 21/4803; H01L 23/13; H01L 23/66

See application file for complete search history.

(56) References Cited

U.S. PATENT DOCUMENTS 6,903,700 B2 * 6/2005 Maruhashi ............... H01P 5/185
333/125
9,172,131 B2 * 10/2015 Chen .................. H01Q 21/0093
(Continued)

FOREIGN PATENT DOCUMENTS

TW   I255560 B * 1/2004 ........... H01L 3/0203
TW   I556332 B * 3/2014 ............. H01L 21/58

*Primary Examiner* — Hai V Tran
*Assistant Examiner* — Bamidele A Jegede
(74) *Attorney, Agent, or Firm* — Hsuanyeh Law Group PC

(57) ABSTRACT

An electronic package and a method for fabricating the same are provided. The method includes stacking an antenna board on a circuit board, and disposing between the antenna board and the circuit board a supporting body securing the antenna board and the circuit board. As such, during a packaging process, the distance between the antenna board and the circuit board is kept unchanged due to the supporting body, thus ensuring that the antenna board operates properly and improving the product yield.

27 Claims, 5 Drawing Sheets

(51) Int. Cl.
  *H05K 1/18*   (2006.01)
  *H05K 3/36*   (2006.01)
  *H05K 3/34*   (2006.01)
  *H05K 3/28*   (2006.01)
  *H05K 1/14*   (2006.01)
  *H05K 1/02*   (2006.01)
  *H01L 23/00*  (2006.01)

(52) U.S. Cl.
  CPC ............ *H05K 3/341* (2013.01); *H05K 3/368* (2013.01); *H01L 24/16* (2013.01); *H01L 2224/16227* (2013.01); *H05K 1/0243* (2013.01); *H05K 2201/042* (2013.01); *H05K 2201/049* (2013.01); *H05K 2201/09063* (2013.01); *H05K 2201/10545* (2013.01); *H05K 2201/10674* (2013.01); *H05K 2201/10734* (2013.01); *H05K 2201/2036* (2013.01)

(56) References Cited

U.S. PATENT DOCUMENTS

| | | | | |
|---|---|---|---|---|
| 2002/0158722 | A1* | 10/2002 | Maruhashi | H01P 5/185 333/246 |
| 2004/0125040 | A1* | 7/2004 | Ferguson | G06K 19/07749 343/895 |
| 2009/0224851 | A1* | 9/2009 | Feiertag | H03H 9/105 333/186 |
| 2009/0231225 | A1* | 9/2009 | Choudhury | H04B 7/0682 343/893 |
| 2009/0251356 | A1* | 10/2009 | Margomenos | H01Q 1/3233 342/70 |
| 2010/0073255 | A1* | 3/2010 | Noll | H01L 23/66 343/873 |
| 2010/0177012 | A1* | 7/2010 | Morrow | H01Q 21/0025 343/893 |
| 2010/0238067 | A1* | 9/2010 | Nakabayashi | H01Q 21/0075 342/70 |
| 2011/0279190 | A1* | 11/2011 | Liu | H01P 5/085 333/32 |
| 2013/0187266 | A1* | 7/2013 | Chen | H01L 24/81 257/737 |
| 2014/0035097 | A1* | 2/2014 | Lin | H01L 23/66 257/E29.325 |
| 2014/0145883 | A1* | 5/2014 | Baks | H01L 23/66 343/700 MS |
| 2014/0285393 | A1* | 9/2014 | Biglarbegian | H01P 11/001 333/260 |
| 2014/0367854 | A1* | 12/2014 | Zhao | H01L 23/32 257/738 |
| 2015/0041972 | A1* | 2/2015 | Shih | H01L 25/50 257/737 |
| 2015/0070228 | A1* | 3/2015 | Gu | H01Q 25/00 343/727 |
| 2015/0123744 | A1* | 5/2015 | Nishimura | H03H 9/1007 333/133 |
| 2015/0187723 | A1* | 7/2015 | Huang | H01L 24/16 257/738 |
| 2015/0325516 | A1* | 11/2015 | Lin | H01L 25/50 257/774 |
| 2015/0340765 | A1* | 11/2015 | Dang | H01Q 1/2208 343/893 |
| 2016/0049723 | A1* | 2/2016 | Baks | H01Q 13/10 343/848 |
| 2016/0056544 | A1* | 2/2016 | Garcia | H01Q 9/0407 343/725 |
| 2016/0263709 | A1* | 9/2016 | Cheng | B23K 35/30 |
| 2016/0329299 | A1* | 11/2016 | Lin | H01L 23/3128 |
| 2017/0025358 | A1* | 1/2017 | McChesney | H01L 24/32 |
| 2017/0040266 | A1* | 2/2017 | Lin | H01L 23/5383 |
| 2017/0117214 | A1* | 4/2017 | Park | H01L 25/03 |
| 2017/0222316 | A1* | 8/2017 | Mizunuma | H01Q 21/062 |
| 2018/0061809 | A1* | 3/2018 | Chiu | H01L 23/49541 |
| 2018/0061810 | A1* | 3/2018 | Lin | H01L 23/5385 |
| 2019/0181096 | A1* | 6/2019 | Wu | H01L 21/32051 |
| 2019/0348747 | A1* | 11/2019 | Liu | H01L 23/66 |
| 2019/0348756 | A1* | 11/2019 | Liu | H01L 24/13 |

\* cited by examiner ated with small size, light weight and easy fabrication.

ELECTRONIC PACKAGE AND METHOD FOR FABRICATING THE SAME

CROSS-REFERENCE TO RELATED APPLICATION

This Application claims under 35 U.S.C. § 119(e) the benefit of Taiwanese Patent Application No. 106136127 filed on Oct. 20, 2017, the entire contents of which are incorporated herein by reference in their entirety.

BACKGROUND

1. Technical Field

The present disclosure relates to electronic packages, and, more particularly, to an electronic package having an antenna structure and a method for fabricating the electronic package.

2. Description of Related Art

Wireless communication technologies have been widely applied in various types of consumer electronic products to facilitate receiving/sending of wireless signals. To meet the miniaturization requirement of consumer electronic products, wireless communication modules are becoming lighter, thinner, shorter and smaller. For example, patch antennas have been widely applied in wireless communication modules of electronic products such as cell phones due to their advantages of small size, light weight and easy fabrication.

FIG. 1 is a schematic cross-sectional view of a conventional wireless communication module 1. Referring to FIG. 1, a circuit board 10 is provided. A semiconductor chip 11 is disposed on a lower side of the circuit board 10 and a substrate 12 having an antenna (not shown) is stacked on an upper side of the circuit board 10 through a plurality of solder bumps 18. The circuit board 10 has a grounding plate (not shown) and an antenna feed line (not shown). Further, a plurality of solder balls 19 are disposed on the lower side of the circuit board 10. An open region A (i.e., there is no adhesive material or molding compound formed therein) is defined between the circuit board 10 and the substrate 12, and surrounded by the solder bumps 18. Further, the distance L between the circuit board 10 and the substrate 12 needs to be controlled to ensure the signal transmission quality between the antenna and the semiconductor chip.

However, after the substrate 12 is stacked on the circuit board 10, the overall structure is turned upside down and the solder balls 19 are reflowed. During the reflow process, the solder bumps 18 are melted. Since the substrate 12 descends due to gravity, the solder bumps 18 are stretched, thus increasing the distance L between the circuit board 10 and the substrate 12 and hence adversely affecting the function of the antenna and the product yield.

Therefore, there is a need to provide an electronic package and a fabrication method thereof so as to overcome the above-described drawbacks.

SUMMARY

In view of the above-described drawbacks, the present disclosure provides an electronic package, which comprises: a first substrate having an antenna structure; a second substrate having a circuit layer, wherein the second substrate and the first substrate are stacked on each other; a plurality of conductive elements disposed between the first substrate and the second substrate and electrically connected to the first substrate and the second substrate; and at least one supporting body disposed between the first substrate and the second substrate and securing the first substrate and the second substrate. The supporting body is not electrically connected to the first substrate and the second substrate.

The present disclosure further provides a method for fabricating an electronic package, which comprises: stacking a first substrate on a second substrate through a plurality of conductive elements, wherein the first substrate has an antenna structure and the second substrate has a circuit layer; and disposing between the first substrate and the second substrate at least one supporting body securing the first substrate and the second substrate. The supporting body is not electrically connected to the first substrate and the second substrate.

In an embodiment, the supporting body is formed by filling an adhesive material between the first substrate and the second substrate, wherein the adhesive material is in contact with the first substrate and the second substrate; and curing the adhesive material.

In an embodiment, the first substrate is stacked on and electrically connected to the second substrate through the conductive elements.

In an embodiment, a central open region, a middle connecting region and a peripheral supporting region are defined between the first substrate and the second substrate. In an embodiment, the conductive elements are disposed in the middle connecting region, and the supporting body is disposed in the peripheral supporting region.

In an embodiment, at least one through hole is formed in the first substrate and corresponds in position to the supporting body. In another embodiment, the through hole is positioned in an outer peripheral region of the first substrate. In yet another embodiment, the through hole communicates with a side surface of the first substrate.

In an embodiment, the supporting body protrudes from a side surface of the first substrate.

In an embodiment, the first substrate is narrower than the second substrate.

In an embodiment, the supporting body is made of an insulating material.

In an embodiment, the supporting body is made of a thermosetting adhesive material.

In an embodiment, an electronic component is disposed on the second substrate. In another embodiment, the second substrate has a first side and a second side opposing the first side. In an embodiment, the first substrate is stacked on the first side of the second substrate, and the electronic component is disposed on the second side of the second substrate.

In an embodiment, the conductive elements are not electrically connected to the antenna structure.

In an embodiment, the second substrate has an antenna body. In another embodiment, the antenna body is electrically isolated from the circuit layer, or the conductive elements are not electrically connected to the antenna body.

According to the present disclosure, since the supporting body securely connects the first substrate and the second substrate, the distance between the first substrate and the second substrate is kept unchanged during a packaging process such as a reflow process, thereby overcoming the conventional drawback of stretching of the conductive elements caused by descending of the first substrate due to gravity, ensuring the antenna structure to operate properly and improving the product yield.

DETAILED DESCRIPTION OF EMBODIMENTS

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "a" etc. are merely for illustrative purposes and should not be construed to limit the scope of the present disclosure.

FIGS. 2A to 2D are schematic cross-sectional views showing a method for fabricating an electronic package 2 according to the present disclosure.

Figure 1:
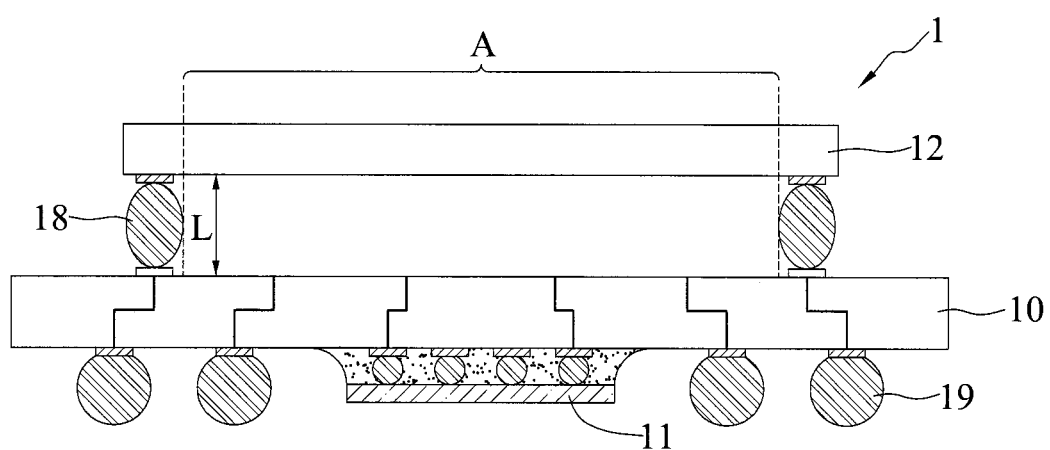
FIG. 1 is a schematic cross-sectional view of a conventional wireless communication module.
Figure 2A:
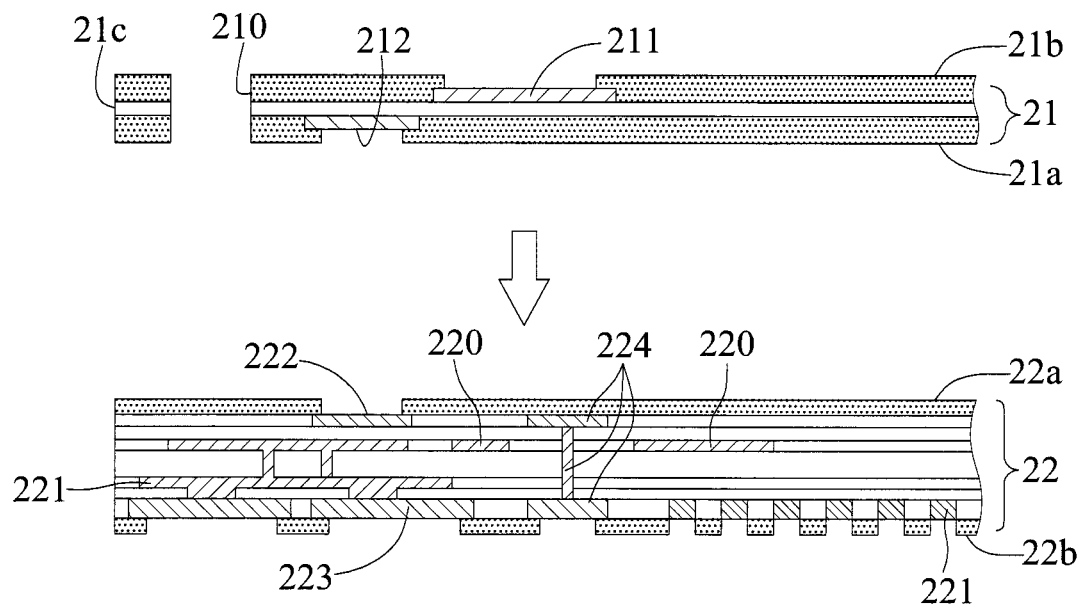
FIGS. 2A to 2D are schematic cross-sectional views showing a method for fabricating an electronic package according to the present disclosure.

Referring to FIG. 2A, a first substrate 21 is stacked on a second substrate 22. The first substrate 21 has a first surface 21a, a second surface 21b opposing to the first surface 21a, a side surface 21c adjacent to and connected to the first surface 21a and the second surface 21b, and at least one through hole 210 communicating the first surface 21a with the second surface 21b.

In an embodiment, the first substrate 21 is an antenna board having an antenna structure 211 and a plurality of first electrical contacts 212. In another embodiment, the antenna structure 211 is a line type antenna and electrically isolated from the first electrical contacts 212.

The second substrate 22 is a circuit board, which has a first side 22a and a second side 22b opposing to the first side 22a. Further, the second substrate 22 has an antenna body 224, a grounding plate 220, and a circuit layer 221 electrically connected to the grounding plate 220. In an embodiment, the antenna body 224 is a line type antenna and electrically isolated from the circuit layer 221 (or the grounding plate 220). In another embodiment, the circuit layer 221 has a plurality of second electrical contacts 222 and a plurality of conductive pads 223. In yet another embodiment, the second substrate 22 is a chip carrier.

Figure 3A:
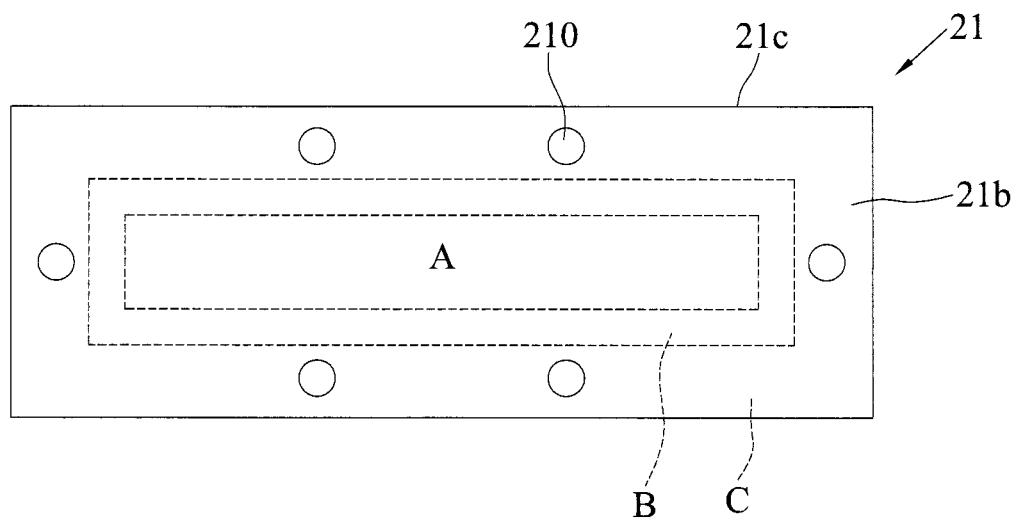
FIG. 3A is a schematic upper view of a first substrate of FIG. 2C.

Referring to FIG. 3A, the through hole 210 of a circular shape is positioned in an outer peripheral region of the first substrate 21, without communicating with the side surface 21c. Alternatively, referring to FIG. 3B, the through hole 310 of a semicircular shape communicates with the side surface 21c of the first substrate 21.

Figure 2B:
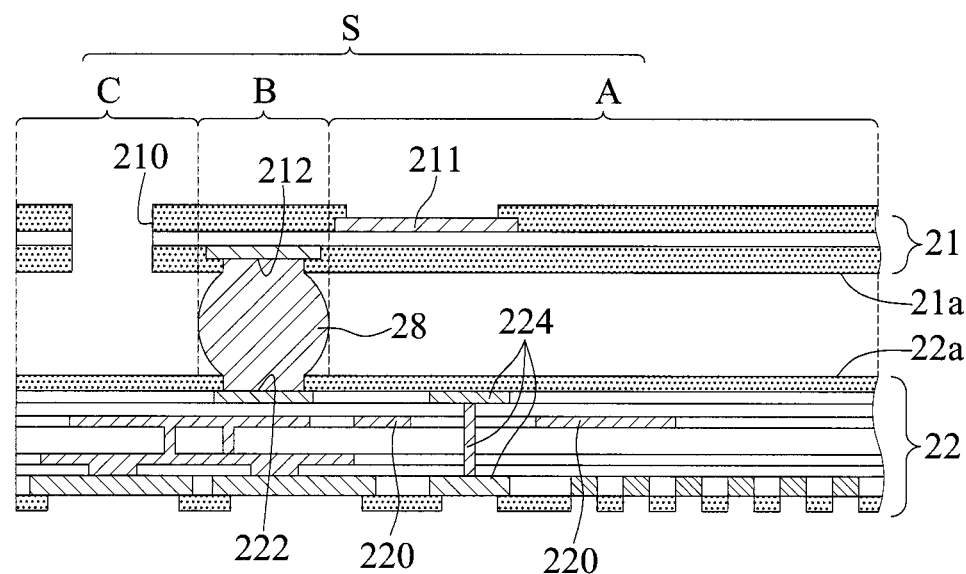

Referring to FIG. 2B, the first surface 21a of the first substrate 21 is stacked on the first side 22a of the second substrate 22 through a plurality of conductive elements 28.

In an embodiment, the conductive elements 28 are disposed between the first electrical contacts 212 and the corresponding second electrical contacts 222 to electrically connect the first substrate 21 and the second substrate 22. Further, the antenna structure 211 senses the antenna body 224 for transmitting signals therebetween.

The conductive elements 28 can be copper posts. Alternatively, the conductive elements 28 can be made of a solder material.

Further, the conductive elements 28 are not electrically connected to the antenna structure 211 and the antenna body 224. In an embodiment, the conductive elements 28 are electrically connected to the grounding plate 220 or a dummy pad. That is, the first electrical contacts 212 or the second electrical contacts 222 can serve as dummy pads without any electrical function.

Furthermore, referring to FIGS. 2B and 3A, a central open region A, a middle connecting region B and a peripheral supporting region C can be defined in the region S enclosed between the first substrate 21 and the second substrate 22. No adhesive material or molding compound is formed in the central open region A, thus ensuring the signal transmission quality of the antenna structure 211. The conductive elements 28 are disposed in the middle connecting region B, surrounding the central open region A. The peripheral supporting region C surrounds the middle connecting region B.

Figure 2C:
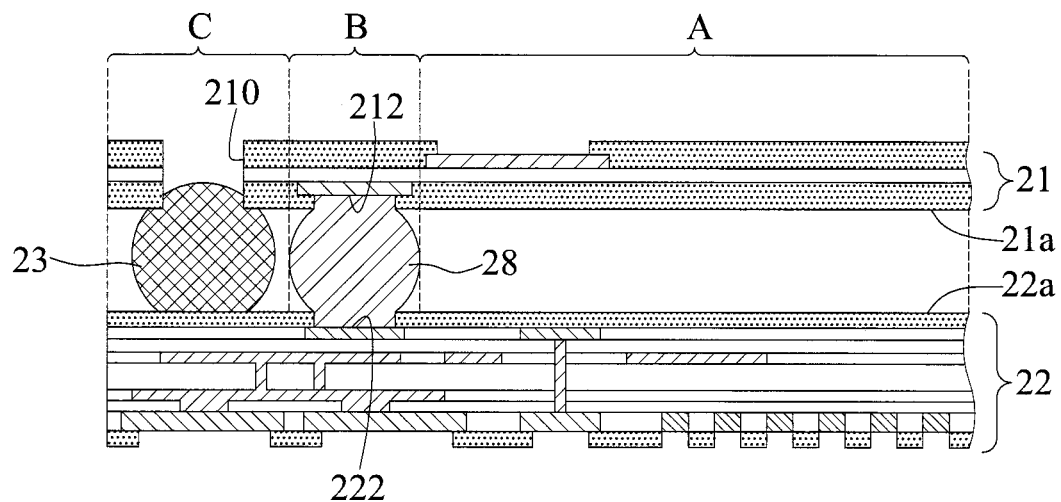

Referring to FIG. 2C, a supporting body 23 is disposed in the peripheral supporting region C between the first surface 21a of the first substrate 21 and the first side 22a of the second substrate 22 through the through hole 210, thus securing the first substrate 21 and the second substrate 22. The supporting body 23 is not electrically connected to the first substrate 21 and the second substrate 22.

In an embodiment, the supporting body 23 is made of an insulating material, such as an adhesive material, and is exposed from the through hole 210 or the second surface 21b of the first substrate 21. In an embodiment, the supporting body 23 is formed by injecting, with a dispenser, a thermosetting adhesive material between the first substrate 21 and the second substrate 22 through the through hole 210 so as to come into contact with the first surface 21a of the first substrate 21 and the first side 22a of the second substrate 22 (and the wall of the through hole 210), and heating and curing the thermosetting adhesive material, to form the supporting body 23.

Figure 3B:
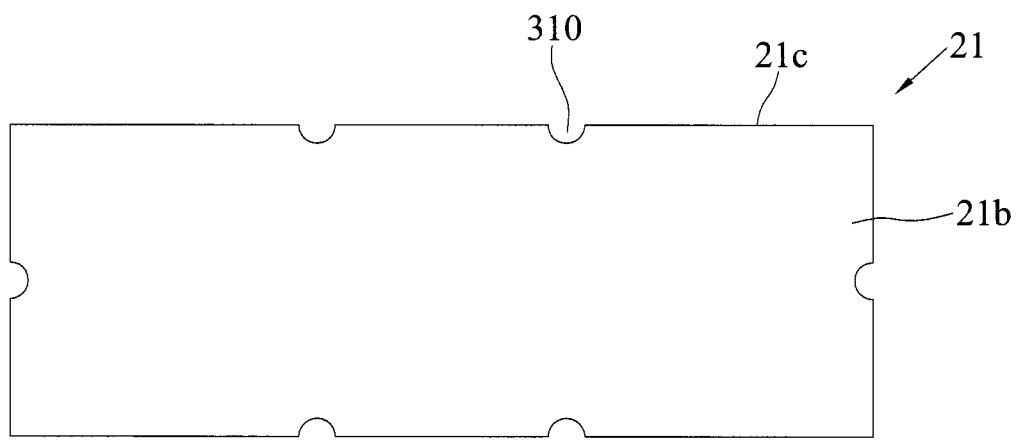
FIG. 3B shows another embodiment of FIG. 3A.

If the through hole 310 has a semicircular shape of FIG. 3B, a larger dispenser can be used to reduce the cost.

Further, the supporting body 23 can be partially positioned in the through hole 210.

Figure 2D:
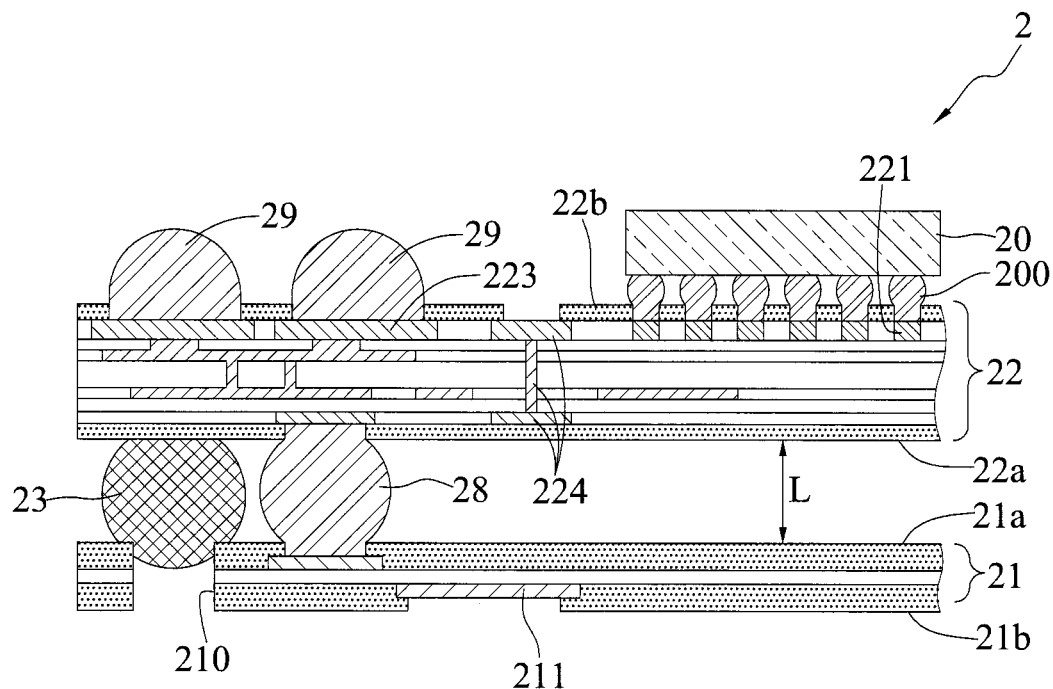

Referring to FIG. 2D, the overall structure is turned upside down, and at least one electronic component 20 is disposed on the second side 22b of the second substrate 22, Further, a plurality of conductive elements, such as solder balls 29, are disposed on the conductive pads 223 and reflowed so as for an electronic structure, such as a circuit board, to be disposed thereon. As such, an electronic package 2 is obtained.

The electronic component 20 can be an active component, such as a semiconductor chip, a passive component, such as a resistor, a capacitor or an inductor, or a combination thereof. In an embodiment, the electronic component 20 is disposed in a flip-chip manner on and electrically connected to the circuit layer 221 through a plurality of conductive bumps 200. In another embodiment, the electronic component 20 is electrically connected to the circuit layer 221 through a plurality of bonding wires (not shown). In a further embodiment, the electronic component 20 is in direct contact with the circuit layer 221 so as to be electrically connected to the circuit layer 221.

In an embodiment, the electronic component 20 can be disposed between the first substrate 21 and the second substrate 22 (for example, on the first side 22a of the second substrate 22).

Figure 4:
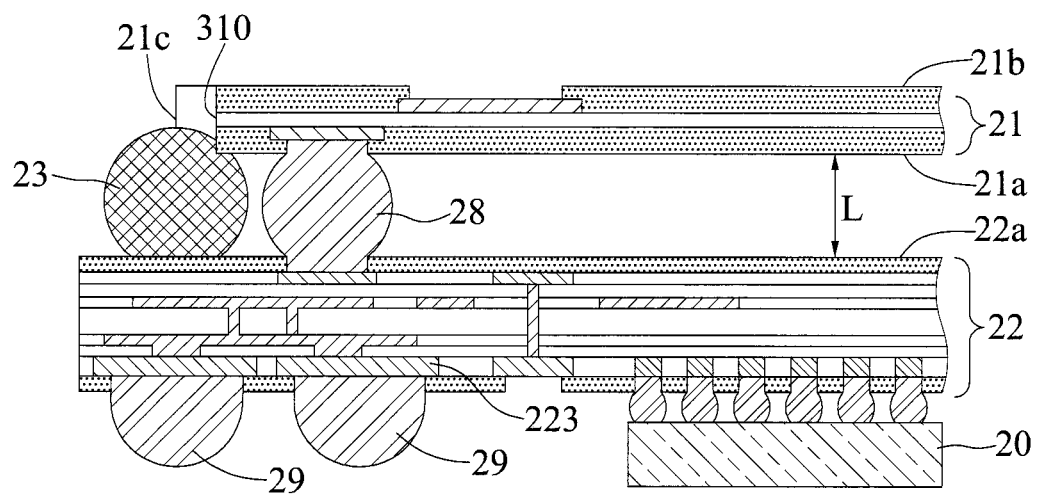
FIGS. 4 and 5 are schematic cross-sectional views showing electronic packages according to other embodiments of the present disclosure.

Referring to FIG. 4, if the through hole 310 of FIG. 3B is used, the supporting body 23 does not protrude, or protrudes from the side surface 21c of the first substrate 21 (for example, come into contact with the side surface 21c of the first substrate 21 and the wall of the through hole 310).

Figure 5:
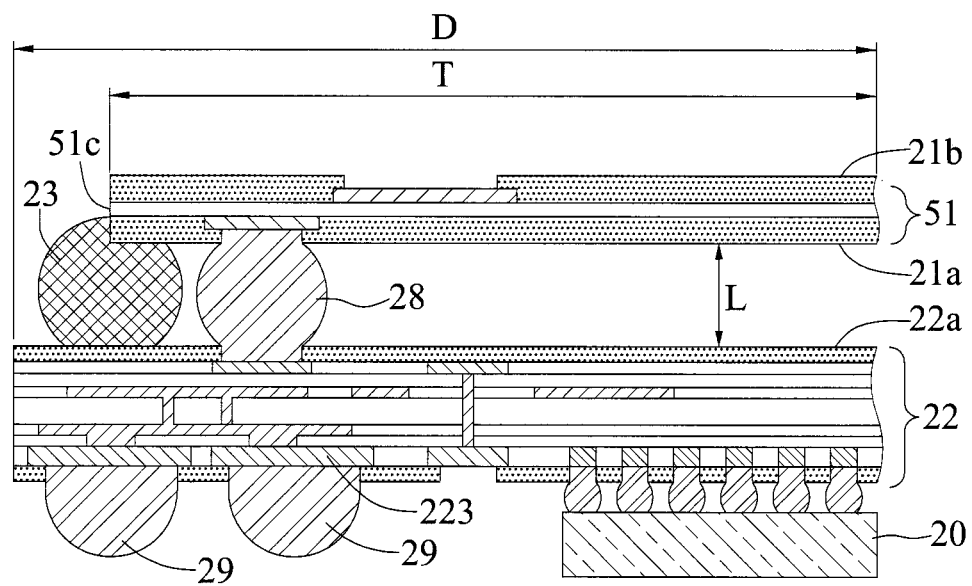

Further, referring to FIG. 5, the width T of the first substrate 51 is less than the width D of the second substrate 22. As such, the supporting body 23 protrudes from the side surface 51c of the first substrate 51 (for example, come into contact with the side surface 21c of the first substrate 21), thereby dispensing with the through hole 210,310.

According to the present disclosure, since the supporting body 23 secures the first substrate 21, 51 and the second substrate 22, the distance L between the first substrate 21, 51 and the second substrate 22 is kept unchanged during reflow of the solder balls 29 or a subsequent high-temperature baking process, thereby overcoming the conventional drawback of stretching of the melted conductive elements 28 caused by descending of the first substrate 21, 51 due to gravity. As such, the present disclosure ensures that the antenna structure 211 and the antenna body 224 operate properly and hence effectively controls the antenna quality and improves the product yield.

The present disclosure further provides an electronic package 2, which has: a first substrate 21, 51 having an antenna structure 211; a second substrate 22 having a circuit layer 221, wherein the second substrate 22 and the first substrate 21, 51 are stacked on each other; a plurality of conductive elements 28 disposed between the first substrate 21,51 and the second substrate 22; and at least one supporting body 23 disposed between the first substrate 21, 51 and the second substrate 22 and securing the first substrate 21, 51 and the second substrate 22. The supporting body 23 is not electrically connected to the first substrate 21, 51 and the second substrate 22.

In an embodiment, at least one through hole 210, 310 is formed in the first substrate 21 and corresponds in position to the supporting body 23. In another embodiment, the through hole 210, 310 is positioned in an outer peripheral region of the first substrate 21. In yet another embodiment, the through hole 310 communicates with a side surface 21c of the first substrate 21.

In an embodiment, the supporting body 23 protrudes from the side surface 21c, 51c of the first substrate 21, 51.

In an embodiment, the width T of the first substrate 51 is less than the width D of the second substrate 22.

In an embodiment, the supporting body 23 is made of an insulating material.

In an embodiment, the supporting body 23 is made of a thermosetting adhesive material.

In an embodiment, the electronic package 2 further comprises at least one electronic component 20 disposed on the second substrate 22. In another embodiment, the second substrate 22 has a first side 22a and a second side 22b opposing the first side 22a, the first substrate 21, 51 is stacked on the first side 22a of the second substrate 22, and the electronic component 20 is disposed on the second side 22b of the second substrate 22.

In an embodiment, the conductive elements 28 are not electrically connected to the antenna structure 211.

In an embodiment, the second substrate 22 further has an antenna body 224. In another embodiment, the antenna body 224 is electrically isolated from the circuit layer 221, or the conductive elements 28 are not electrically connected to the antenna body 224.

According to the present disclosure, the supporting body facilitates to keep the distance between the first substrate and the second substrate unchanged during a high temperature process, thereby ensuring the antenna structure operates properly and improving the product yield.

The above-described descriptions of the detailed embodiments are only to illustrate the implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. An electronic package, comprising:
   a first substrate having an antenna structure, wherein the first substrate has a first surface, a second surface opposing the first surface, and at least one through hole communicating the first surface with the second surface;
   a second substrate having a circuit layer, wherein the second substrate and the first substrate are stacked on each other;
   a plurality of conductive elements of a post shape disposed between the first substrate and the second substrate;
   at least one supporting body of the post shape disposed between the first substrate and the second substrate and securing the first substrate and the second substrate, wherein the through hole corresponds in position to the supporting body; and
   a central open region, a middle connecting region, and a peripheral supporting region defined between the first substrate and the second substrate, wherein the central open region is free from being formed with adhesive material or molding compound, the conductive elements are disposed in the middle connecting region, and the supporting body is disposed in the peripheral supporting region.

2. The electronic package of claim 1, wherein the through hole is positioned in an outer peripheral region of the first substrate.

3. The electronic package of claim 2, wherein the through hole communicates with a side surface of the first substrate.

4. The electronic package of claim 1, wherein the supporting body protrudes from a side surface of the first substrate.

5. The electronic package of claim 1, wherein the first substrate is narrower than the second substrate.

6. The electronic package of claim 1, wherein the supporting body is made of an insulating material or a thermosetting adhesive material.

7. The electronic package of claim 1, wherein the supporting body is free from being electrically connected to the first substrate and the second substrate.

8. The electronic package of claim 1, further comprising an electronic component disposed on the second substrate.

9. The electronic package of claim 8, wherein the second substrate has a first side and a second side opposing the first side, with the first substrate stacked on the first side of the second substrate and the electronic component disposed on the second side of the second substrate.

10. The electronic package of claim 1, wherein the conductive elements are free from being electrically connected to the antenna structure.

11. The electronic package of claim 1, wherein the second substrate has an antenna body.

12. The electronic package of claim 11, wherein the antenna body is electrically isolated from the circuit layer.

13. The electronic package of claim 11, wherein the conductive elements are free from being electrically connected to the antenna body.

14. A method for fabricating an electronic package, comprising:
- stacking a first substrate on a second substrate through a plurality of conductive elements of a post shape, wherein the first substrate has an antenna structure and the second substrate has a circuit layer, and wherein the first substrate has a first surface, a second surface opposing the first surface, and at least one through hole communicating the first surface with the second surface;
- disposing between the first substrate and the second substrate at least one supporting body of the post shape securing the first substrate and the second substrate, wherein the through hole corresponds in position to the supporting body; and
- defining a central open region, a middle connecting region, and a peripheral supporting region between the first substrate and the second substrate, with the conductive elements being disposed in the middle connecting region and the supporting body being disposed in the peripheral supporting region, wherein the central open region is free from being formed with adhesive material or molding compound.

15. The method of claim 14, wherein the through hole is positioned in an outer peripheral region of the first substrate.

16. The method of claim 15, wherein the through hole communicates with a side surface of the first substrate.

17. The method of claim 14, wherein the supporting body protrudes from a side surface of the first substrate.

18. The method of claim 14, wherein the first substrate is narrower than the second substrate.

19. The method of claim 14, wherein the supporting body is made of an insulating material or a thermosetting adhesive material.

20. The method of claim 14, wherein the supporting body is free from being electrically connected to the first substrate and the second substrate.

21. The method of claim 14, further comprising disposing an electronic component on the second substrate.

22. The method of claim 21, wherein the second substrate has a first side and a second side opposing the first side, with the first substrate stacked on the first side of the second substrate and the electronic component disposed on the second side of the second substrate.

23. The method of claim 14, wherein the supporting body is formed by:
- filling an adhesive material between the first substrate and the second substrate for the adhesive material to be in contact with the first substrate and the second substrate; and
- curing the adhesive material to form the supporting body.

24. The method of claim 14, wherein the conductive elements are free from being electrically connected to the antenna structure.

25. The method of claim 14, wherein the second substrate has an antenna body.

26. The method of claim 25, wherein the antenna body is electrically isolated from the circuit layer.

27. The method of claim 25, wherein the conductive elements are free from being electrically connected to the antenna body.

* * * * *